United States Patent [19]
Yang et al.

[11] Patent Number: 6,094,466
[45] Date of Patent: Jul. 25, 2000

[54] HIGH-FREQUENCY CMOS DUAL/MULTI MODULUS PRESCALER

[75] Inventors: Ching-Yuan Yang; Shen-Iuan Liu; Liang-Gee Chen, all of Taipei, Taiwan

[73] Assignee: National Science Council, Taipei, Taiwan

[21] Appl. No.: 08/782,576

[22] Filed: Jan. 10, 1997

[51] Int. Cl.$^7$ .................................................. H03K 21/00
[52] U.S. Cl. ............................................... 377/47; 377/48
[58] Field of Search ........................................ 377/47, 48

[56] References Cited

PUBLICATIONS

J.R. Yuan and C.Svensson. "Fast CMOS Nonbinary Divider and Counter" *Electronics Letters*. vol. 29. Jun. 1993.
Jiren Yuan and C.Svensson. "High–speed CMOS Circuit Technique". *IEEE JSSC*. pp.62–70, Feb. 1989.
"Efficient CMOS Counter Circuits". Electronics Letters. vol. 24, No. 21. Oct. 1988.

*Primary Examiner*—Margaret R. Wambach
*Attorney, Agent, or Firm*—Birch, Stewart, Kolasch & Birch, LLP

[57] ABSTRACT

The invention of the "high-frequency CMOS dual/multi modulus prescaler" is a new application in this field. Compared to other transistors which have CMOS technology, this invention has a greater potential for high frequency operations. Additionally, it has a low-power consumption property and can be easily integrated with CMOS technology. We propose a general construction of the prescaler which can be applied to dual-modulus prescaler. First, a divide-by-3/4 dual-modulus prescaler and a divide-by-4/5 one are presented. Consequently, a general dual-modulus prescaler is developed based on the same technique. Moreover, a general multi-modulus prescaler will also be achieved. The operating frequency can be up to 1 GHz for the proposed dual/multiple modulus prescalers which are fabricated in a 0.8-$\mu$m SPDM CMOS technology.

1 Claim, 11 Drawing Sheets

HIGH-FREQUENCY CMOS DUAL/MULTI MODULUS PRESCALER

BACKGROUND OF THE INVENTION

1. Field of the Invention

The present invention is related to a high frequency CMOS dual/multi modulus prescaler.

2. The Prior Art

CMOS circuits are beneficial to system integration and are able to be formed on the same chip with low frequency circuits, and they are also able to decrease the consumption of circuit power. However, previous CMOS transistors have not been suited for use with bipolar junction transistors or GaAs transistors which are applied in a high frequency operational environment. Although production technology for transistors has been progressing, the operating frequency, which is up to 1 GHz, for the CMOS scaling divider is still an important challenge. And the need for this operating frequency is getting more necessary.

Mr. J. Yuan wrote a report in Electron. Lett., Vol. 24 pp.1311–1313 in 1988, which stated that CMOS transistors can be easily applied for digital dividers or digital counters, and it was an effective implementation. In his report in IEEE Solid-State Circuits, Vol. SC-24, pp. 62–70, 1989, Mr. Yuan wrote a report about applying True Single Phase Clock (TSPC) to CMOS circuits in a high frequency operating environment.

Although transistors, especially the previously stated CMOS transistors, which use TSPC circuitry, are able to operate in a high frequency environment, they have only been applied to single modulus dividers. However, the innovative high-frequency CMOS dual/multi modulus per-scaler according to the invention uses TSPC circuitry for dual/multi dividers.

For conventional circuit construction, bipolar and GaAs circuits are the prescalers mainly used, while only a few use CMOS circuits. With CMOS circuits, the general design of dual modulus prescalers has been of one certain construction only. However, the invention includes a divide-by-3/4 or a divide-by-4/5 circuit applied in a dual and multi modulus, which is different from all other transistor circuits heretofore known.

BRIEF SUMMARY AND OBJECTS OF THE INVENTION

The high-frequent CMOS dual/multi modulus prescaler according to the invention is an innovative creation. The main object of the invention is to provide a simple circuit which allows the prescaler to operate at a high frequency operation.

Another object is to provide a new circuit including the high-frequency CMOS dual/multi modulus scaling divider.

The last object is to provide a circuit construction which is a scaling divider that uses the P-latch and N-latch design of TSPC enabling it to work with a high frequency digital signal. The design originates from a 3/4 divider or a 4/5 divider circuit to develop a 15/16 divider. Furthermore, it can be modified to various kinds of dual/multi modulus prescalers.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.;

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF EMBODIMENTS OF THE INVENTION

Figure 1:
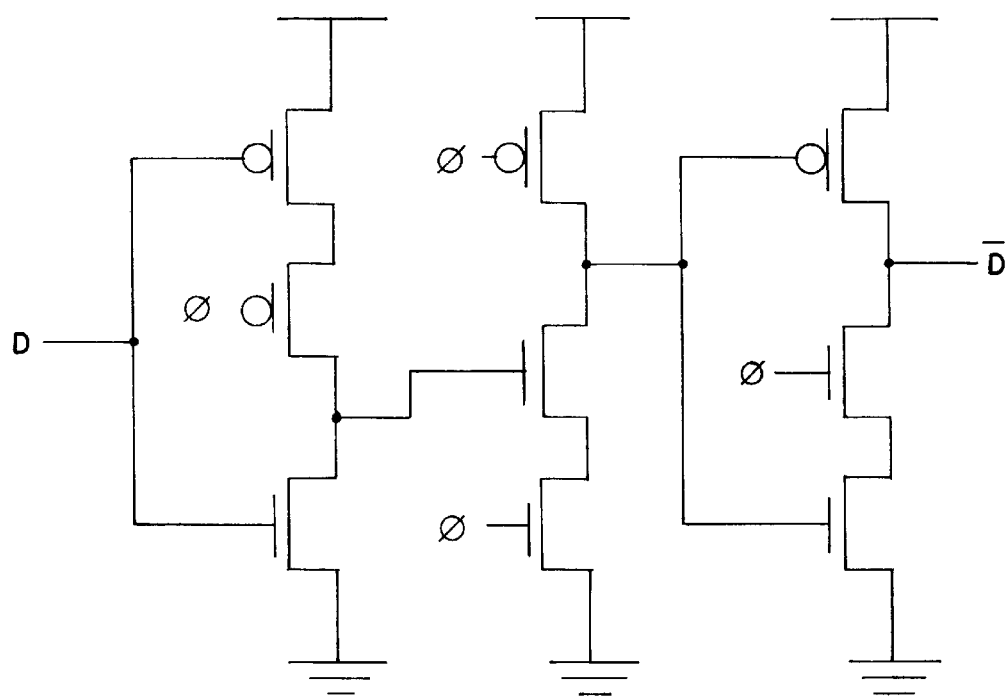
FIG. 1 illustrates a known CMOS circuit.

Mr. J. Yuan's report disclosed a CMOS Transistor circuit in 1988, shown in FIG. 1, which includes 9 transistors which are combined into a TSPC Positive Transition Latch effectively. There are three components to this circuit: a P-C$^2$MOS circuit, a N-Precharge circuit and a N-C$^2$MOS circuit. When the clock φ is at a positive transition, and if the input data is latched at this moment, then that the opposite value is output from the circuit. Therefore, if the opposite output is connected to the input of the circuit, the circuit will form a Divide-by-Two Circuit as shown in FIG. 2.

Figure 2:
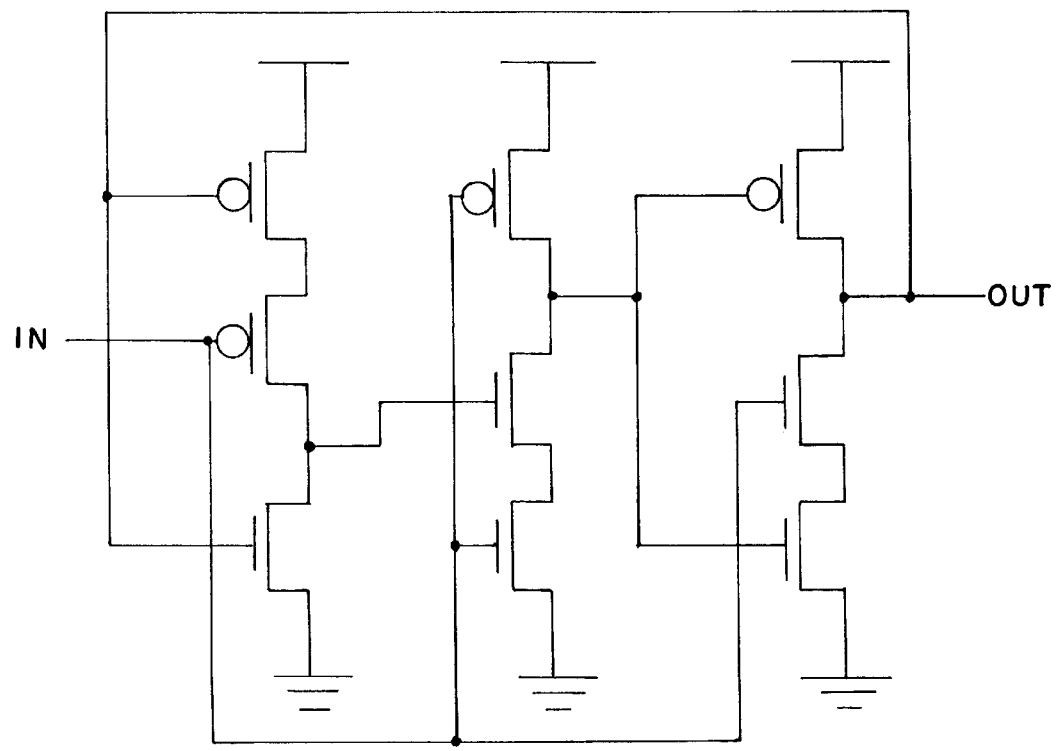
FIG. 2 illustrates a known Divide-by-Two Circuit.
Figure 3:
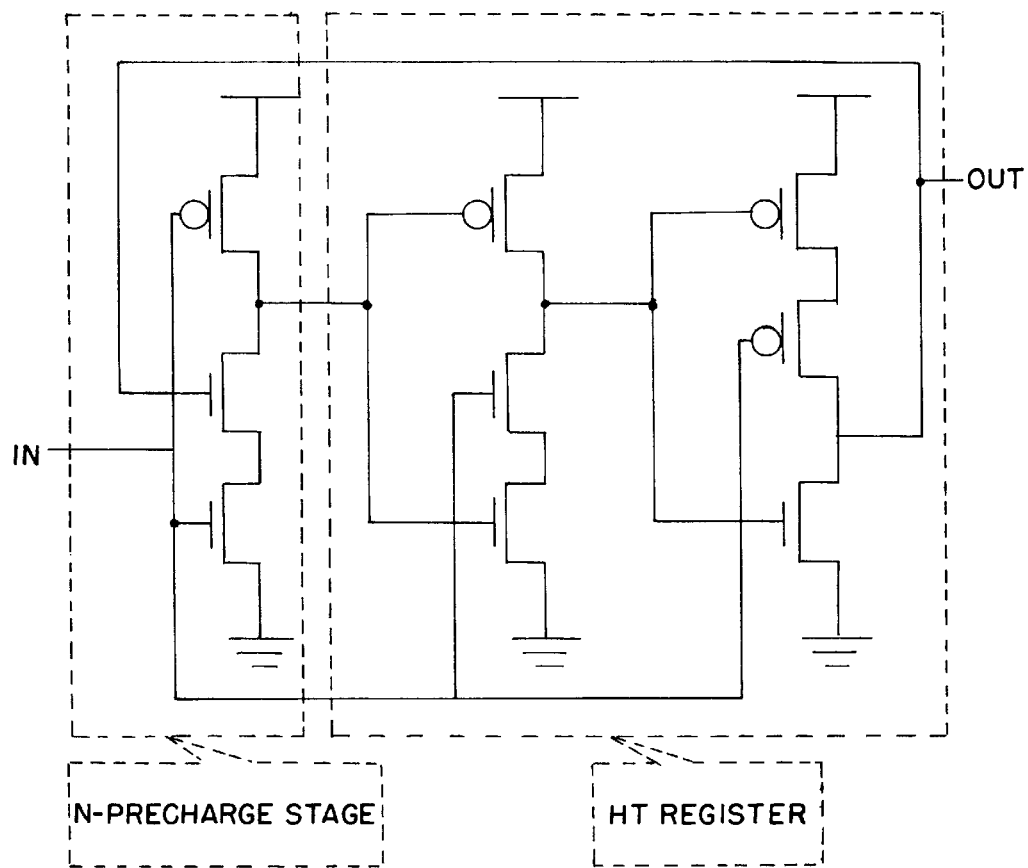
FIG. 3 illustrates two parts of another Divide-by-Two Circuit.
Figure 4:
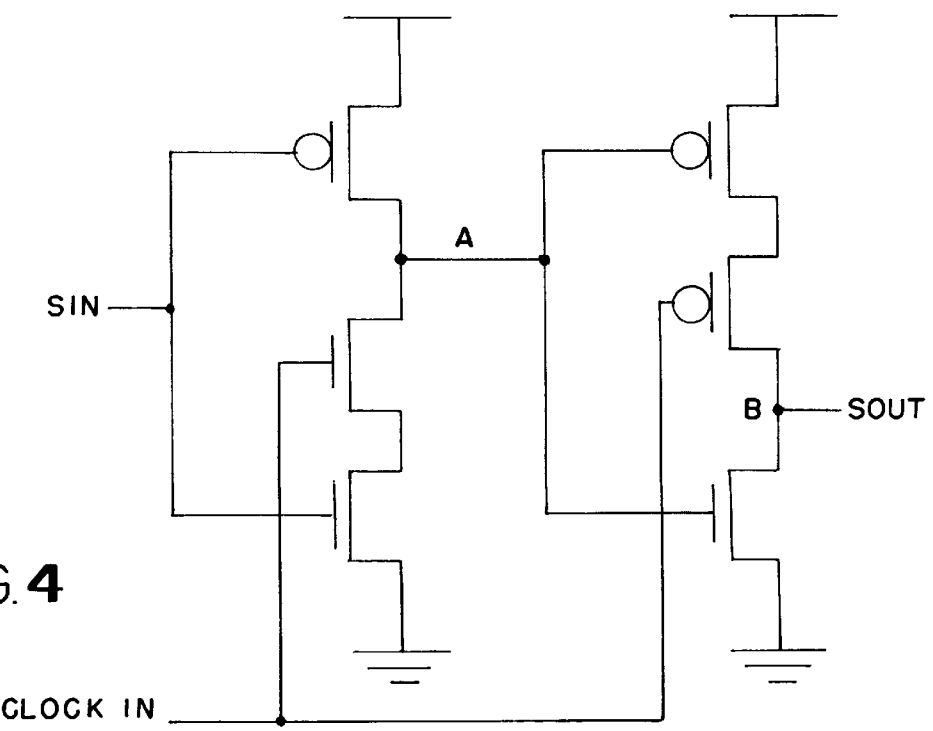
FIG. 4 illustrates a Half Transparent Register employed according to the invention.

Further analysis restructure the Divide-by-Two Circuit in FIG. 2 to the circuit in FIG. 3. In this circuit, a N-Precharge circuit is placed at the front, and N-C$^2$MOS and P-C$^2$MOS circuits are placed at the end. Thus, the Divide-by-Two Circuit is separated into two parts, a N-Precharge circuit and the a Half Transparent Register (HT Register). As shown in FIG. 4, the Half Transparent Register has six transistors consisting of a P-Latch and a N-Latch of TSPC technology. A circuit analysis of the Half Transparent Register using truth tables will explain its operation.

Truth Table one shows the value of point A. When Sin=0 and clock-in=0 or one, the value of point A is one. When Sin=1 and clock-in=0, the value of point A maintains its original value. Thus, when clock-in=1, the value of the output of the CMOS circuit is opposite of the value of the input. Next, as shown in Truth Table two, the values of point B are discussed. When clock-in=0 or the value of point A is one, the value of point B is the opposite of point A. When clock-in=1, and the value of point A is 0, then the value of point B maintains its original value. In whole, as shown in truth Table 3, when Sin=0, no matter whether clock-in=0 or 1, Sout (i.e., the value of point B) is 0 for sure. The response is very rapid. When Sin=0, Sout (i.e., the value of point B) enters a memory format and maintains the original status value, its delaying time depending on the time of clock-in.

Figure 5:
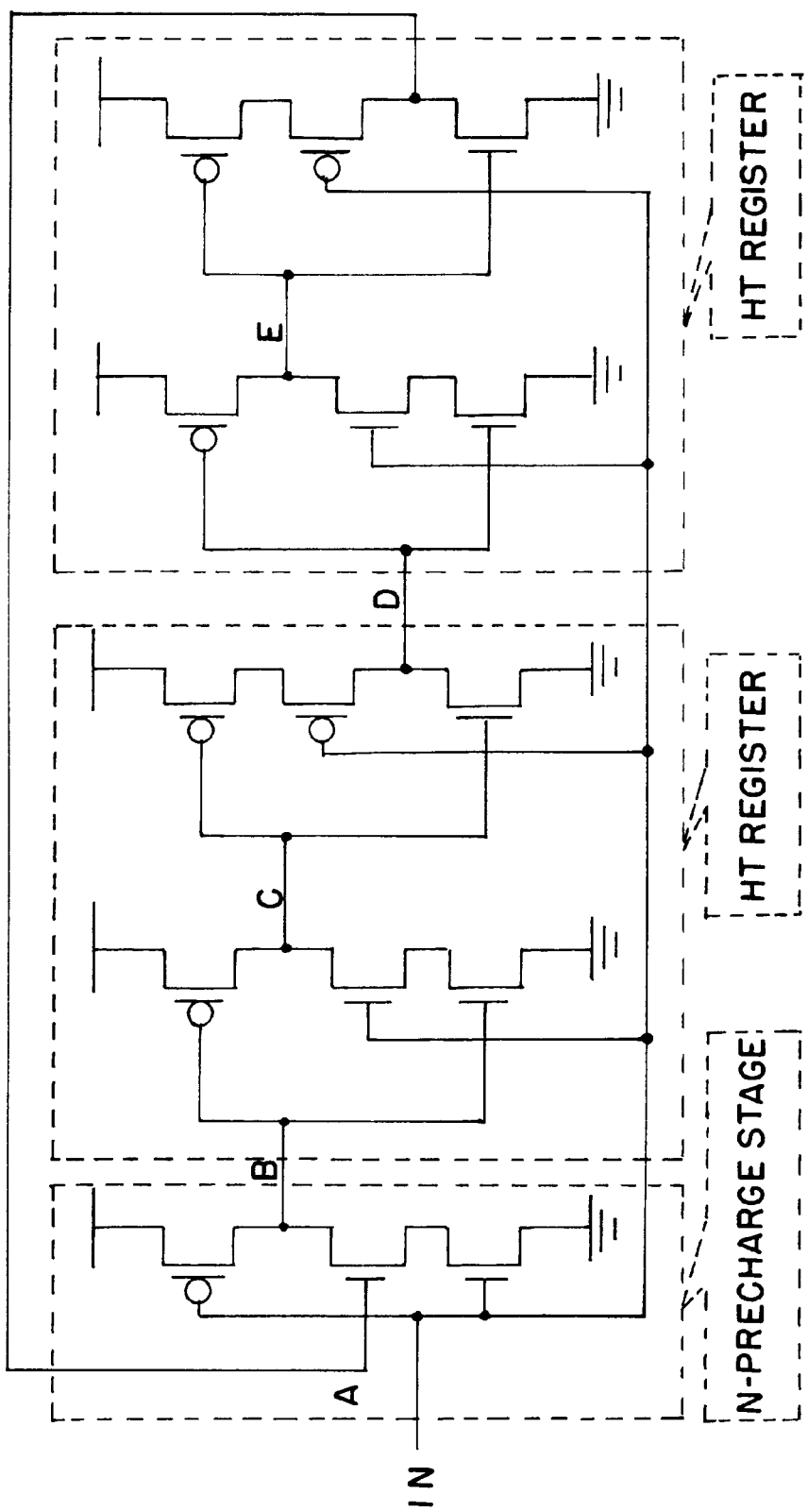
FIG. 5 illustrates a Divide-by-Three circuit according to the invention.
Figure 6:
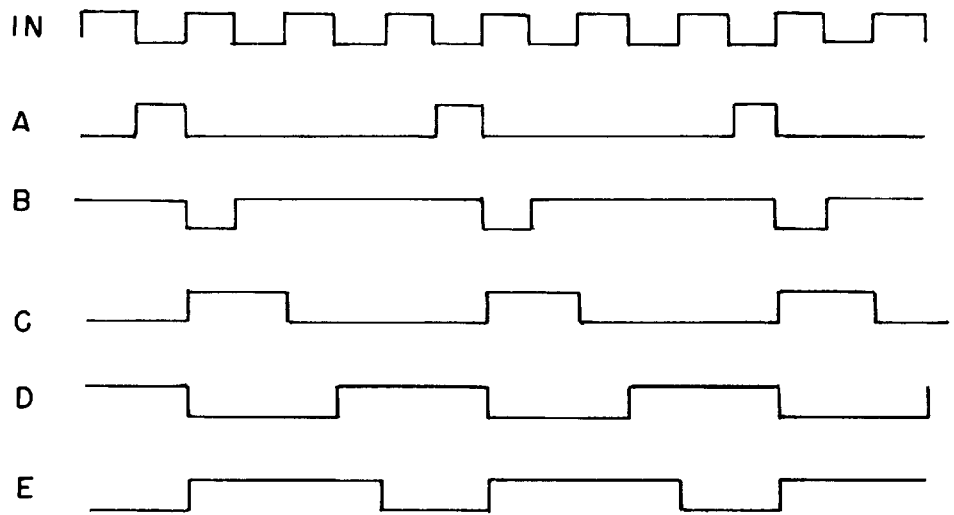
FIG. 6 is a signal chart showing signal values at various nodes in the Divide-by-Three circuit shown in FIG. 5.

Mr. Yuan reported the Divide-by-Three Circuit in Electron. Lett., Vol. 24 pp.1311–1313 in 1998. The invention of the high-frequency CMOS dual/multi modulus prescaler was developed based upon the previously stated construction of the Divide-by-Three circuit, as may be seen from FIG. 5. It has been found that the number of transistors used in the Divide-by-Three circuit is less, its construction is simple, and it is suitable for high frequency operation. For further understanding, a pulse wave is inputted. All signals of circuit points are analyzed from their wave shape as shown in FIG. 6. Assuming that the input pulse wave has a 50% duty cycle, then a symmetrical signal wave shape will be acquired at point D.

Figure 7:
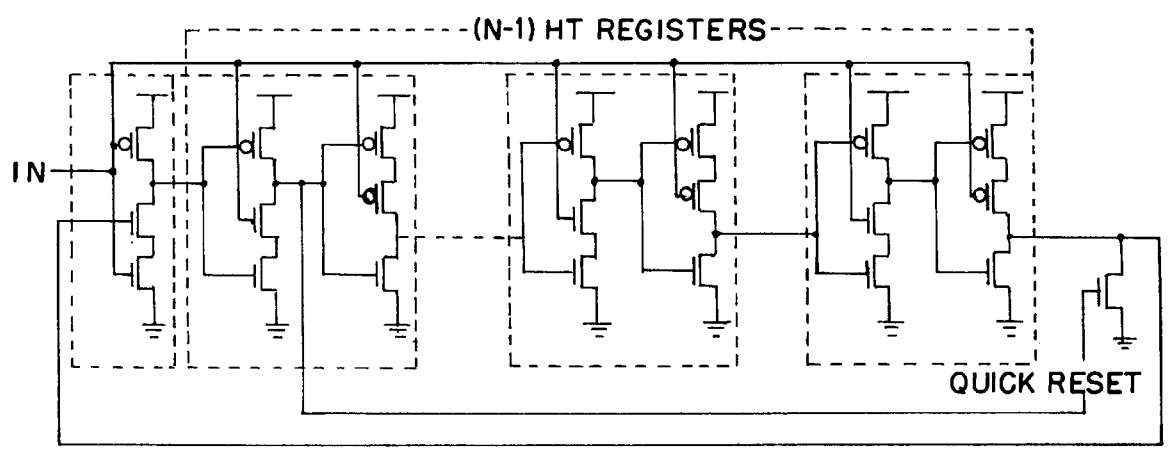
FIG. 7 illustrates a Divide-by-N circuit with a quick reset function according to the invention.

Therefore the whole scaling divider consists of two parts: a N-Precharge circuit and a Half Transparent Register. If design of a Divide-by-N circuit is needed, then as shown in FIG. 7, a N-Precharge at stage one and a Half Transparent Register at each of stages N-1 will complete a Divide-by-N-circuit. When NMOS is added in the circuit as a quick reset, it will increase the speed.

Figure 8:
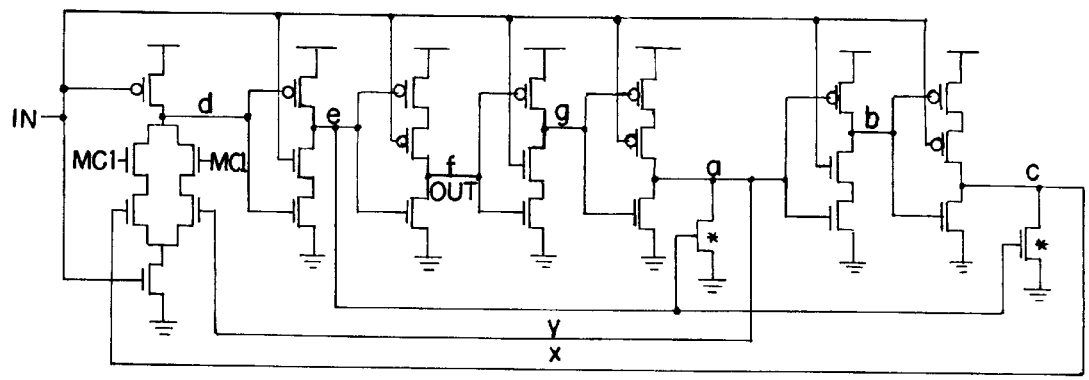
FIG. 8 illustrates a Divide-by-3/4 circuit according to the invention.
Figure 9:
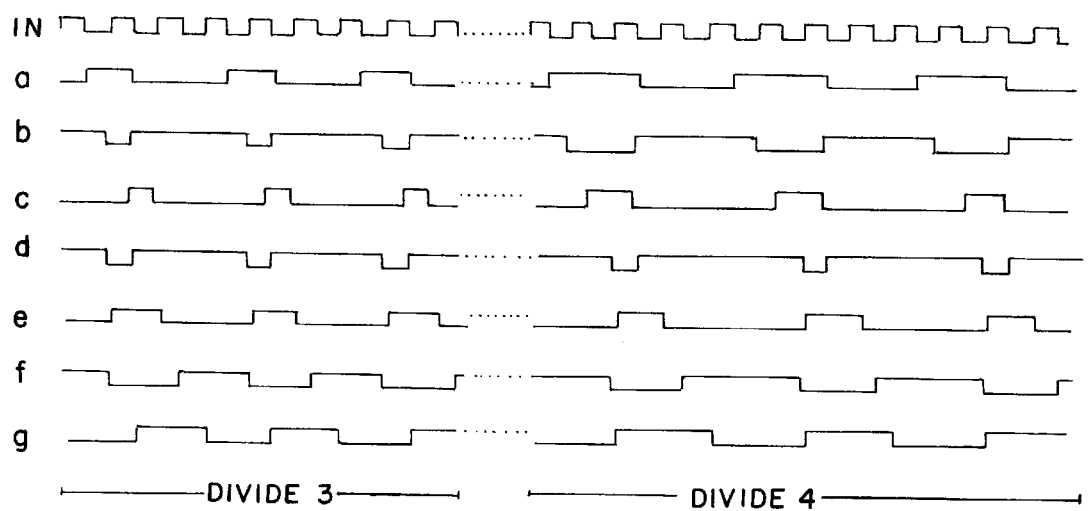
FIG. 9 is a signal chart showing signal values at various nodes in the Divide-by-3/4 circuit shown in FIG. 8.

The Divide-by-3/4 circuit as shown in FIG. 8 is comprised of a N-Precharge circuit and three stages of Half Transparent Registers. This N-Precharge circuit has a dual modulus function: when MC1=0, an X circuit is used for a working route and it becomes a Divide-by-four circuit; when MC1=1, a Y circuit is used for a working route and it becomes a Divide-by-three circuit. FIG. 9 is a signal chart showing the node values of the Divide-by-3/4 circuit.

Figure 10:
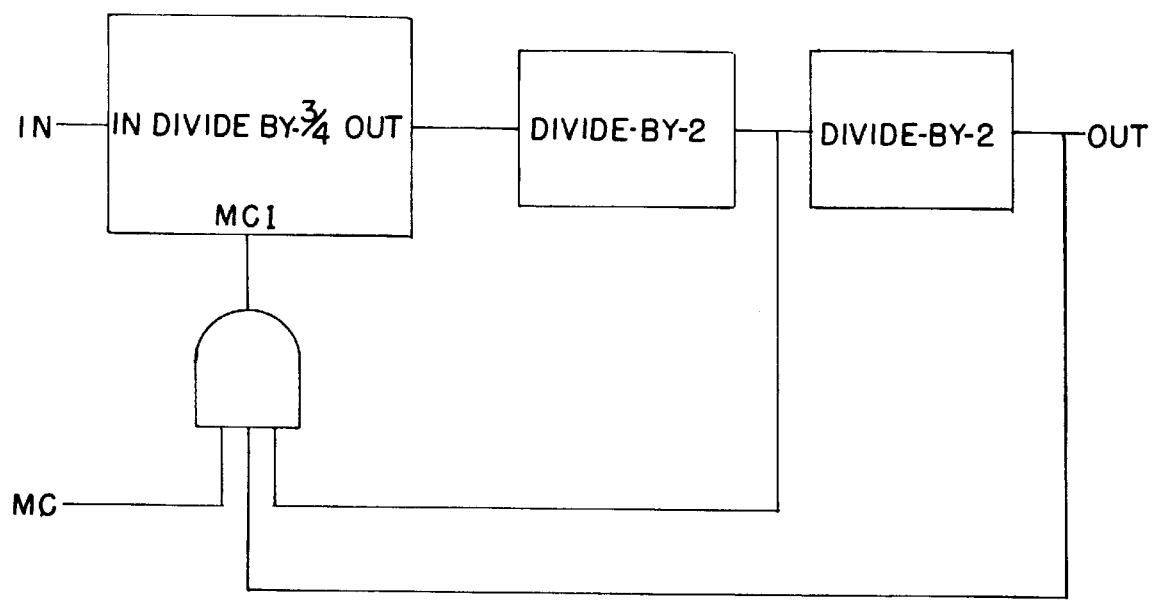
FIG. 10 illustrates a Divide-by-15/16 circuit according to the invention.

When Divide-by-three and Divide-by-four circuits are used as a basis, along with two D Flip-Flops, a Divide-by-15/16 circuit can be formed as shown in FIG. 10. The two D Flip-Flops consist of a ripple counter which is a Divide-by-four circuit. When MC=0, then MC1=0, and the Divide-by-3/4 will drive the work of the Divide-by-four circuit, plus the Divide-by-Four Circuitry of the two D Flip-Flops with the result that the circuitry operates as a Divide-by-16 circuit. On the contrary, when MC=1, and MC1=0, there is a 3/4 cycle of one output cycle operating as a Divide-by-four signal. When MC1=1, there is a 3/4 cycle of one output cycle operating as a Divide-by-three signal which is output from the Divide-by-Four Ripple Counter. According to the formula (3×1/4+4×3/4)×4=15, the circuit will operate as a Divide-by-15 circuit. As for the whole dual modulus Divide-by-15/16 Circuit, the key point for its high frequency operation is the Divide-by-3/4. That is, the Divide-by-3/4 Circuit performs the main part of the work for the high frequency operation to process and output the signal.

Figure 11:
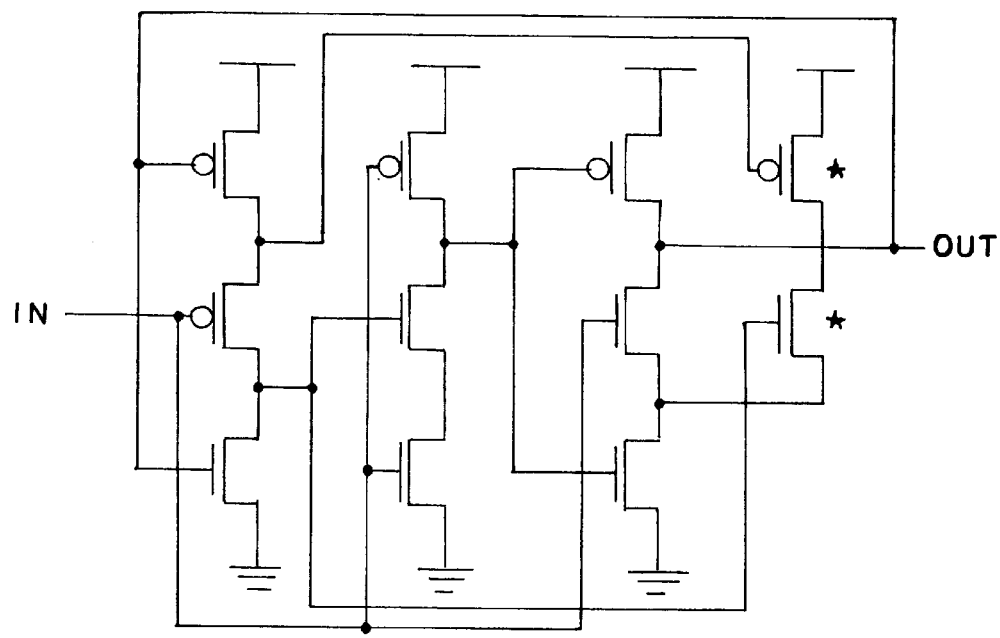
FIG. 11 illustrates a Static Divide by-Two circuit according to the invention.

Mr. Yuan reported a Divide-by-Two Circuit in Electron. Lett., Vol. 24 pp.1311–1313 in 1988, as shown in FIG. 2. Since the circuit is not suitable for low frequency operation, the inventors have developed an improvement on the circuit displayed in FIG. 2. Two tiny transistors (indicated by a * in FIG. 11) are installed at the output ends as shown in FIG. 11. This modification won't influence the functional operation of the circuit, but it will eliminate the unsteady situation while the circuit is working at a low frequency.

Figure 12:
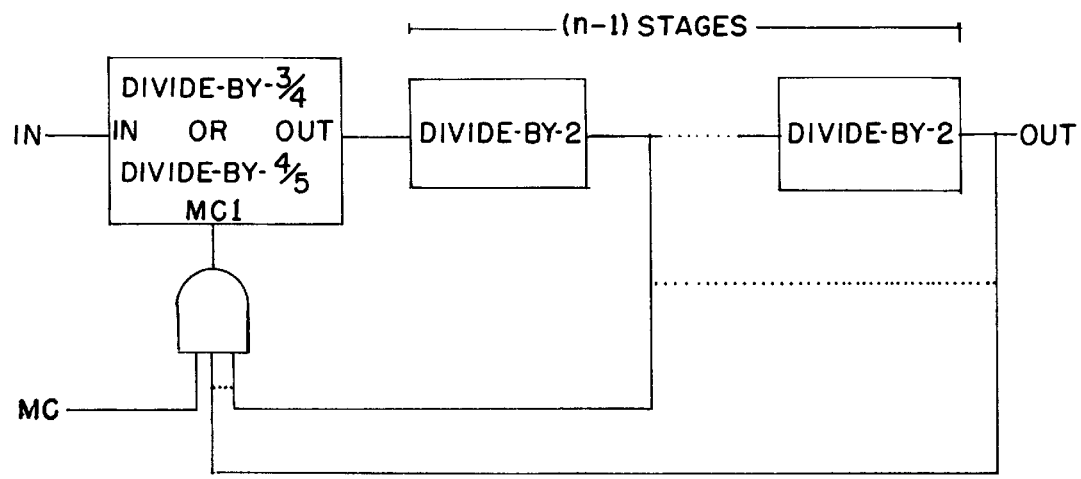
FIG. 12 illustrates a general construction of a dual-modulus prescaler according to the invention.
Figure 13:
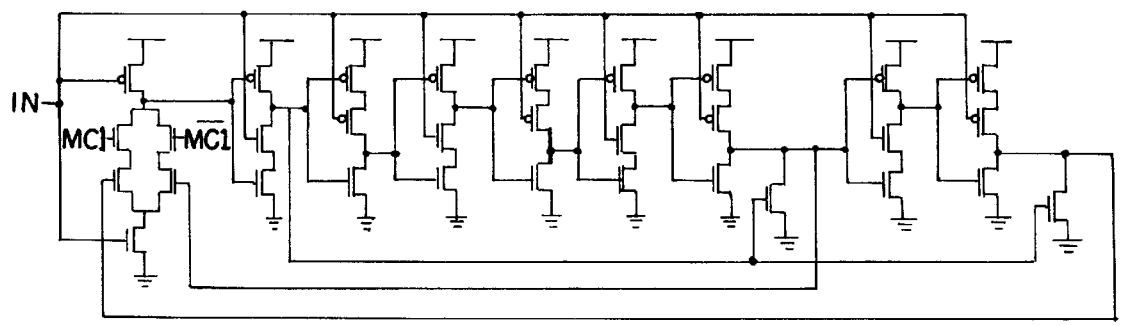
FIG. 13 illustrates a Divide-by-4/5 circuit according to the invention.

FIG. 12 shows a general construction of a dual-modulus prescaler circuit. It is composed of a high frequency dual-modulus prescaler and a Divide-by-Two circuit at each of stages n-1. It is also able to be developed to various dual-modulus divide-by-number circuits. If the circuit concepts shown FIG. 7 are applied to the dual-modulus prescaler, it can be modified into varying circuits like 3/4, 4/5, . . . v/v+1. The most commonly used circuits are the divide-by-3/4 circuit as shown in FIG. 8 and the divide-by-4/5 circuit shown in FIG. 13. When MC1=0, it operates as a divide-by-four circuit. When MC1=1, it operates as a divide-by-five circuit. As to FIG. 12, when the first dual modulus prescaler is a divide-by 3/4 circuit, then its output will be divide-by-$(2^{n+1}-1)/2^{n+1}$, $n \geq 1$; if the first dual modulus prescaler is a divide-by-4/5 circuit, then its output will be divide-by-$2^{n+1}/(2^{n+1}+1)$, $n \geq 1$.

Figure 14:
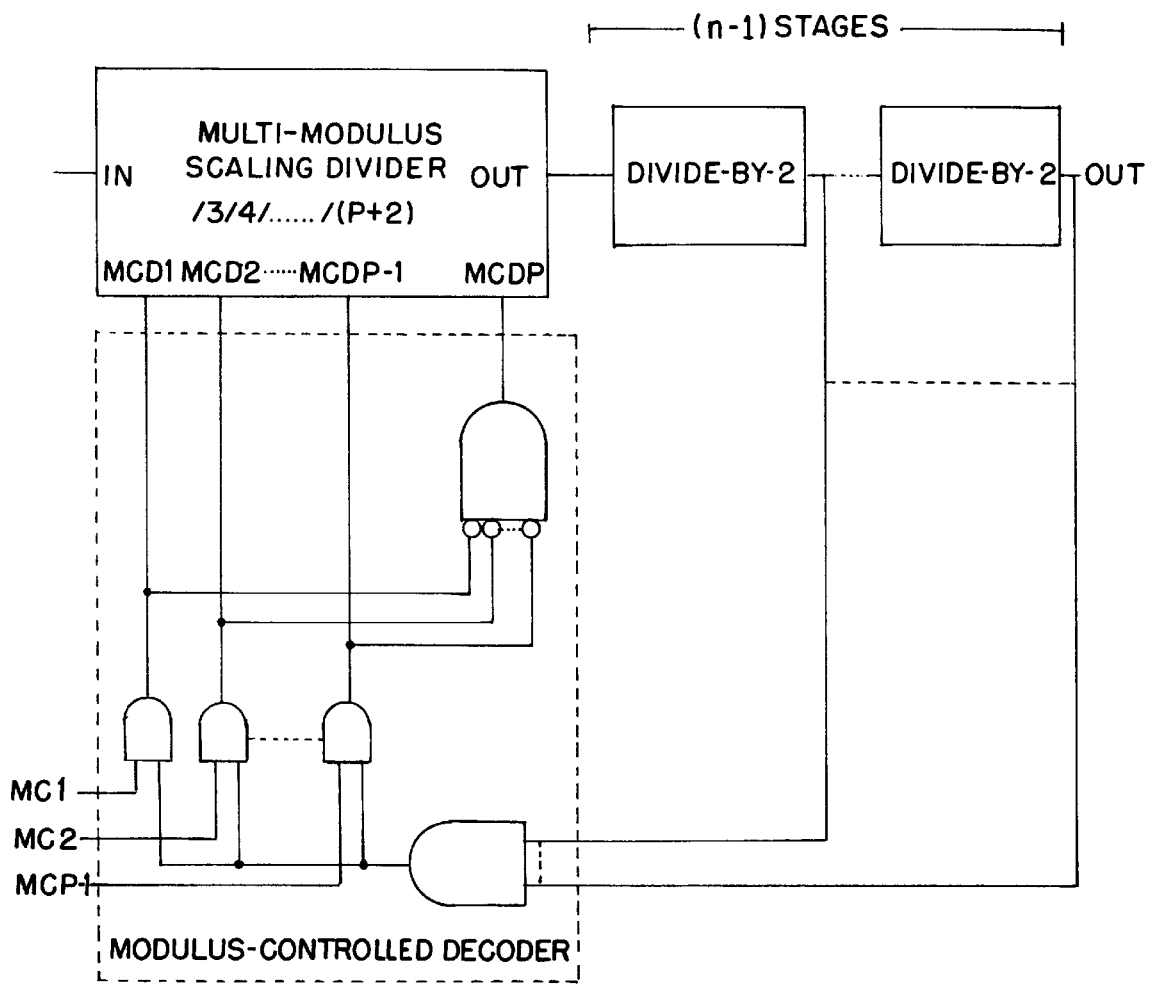
FIG. 14 illustrates a multi modulus prescaler according to the invention.
Figure 15:
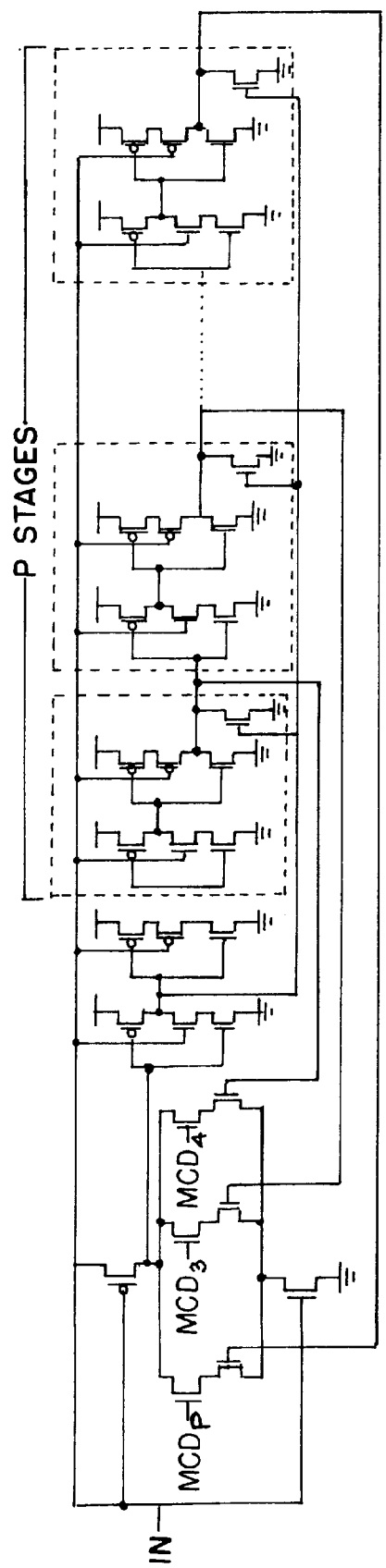
FIG. 15 illustrates a high multi-modulus prescaler according to the invention.

The theory of the multi modulus prescaler is the same as the dual one. FIG. 14 shows a construction of a multi modulus prescaler circuit according to the invention. It is composed of a multi modulus prescaler, a decoding circuit and a Divide-by-Two Ripple Counter at each of stages (n-1). When $mc_x=1$, for x=1, . . . p-1, and $mc_y=0$, $y \neq x$, the decoder selects the Xth modulus. When mcx are all zero, then it is the choice of Pth modulus, so the output is $[(p+2) \times 2^{n-1}-p+1]/[(p+2) \times 2^{n-1}-p+2]/ \ldots /(p+2) \times 2^{n-1}$, where there are p modulus in total. The core circuit is shown as FIG. 15, which is a high frequency multi modulus prescaler, including a N-precharge circuit at stage one, a Half Transparent Register at stage one and half of one Half Transparent Register at stage P with a quick reset circuit. Because the N-precharge circuit has the function of dual modulus, it is able to function as various circuits of Divide-by-3/4 . . . /(p+2). When $mcd_x=1$, the decoder selects the Xth modulus, so the circuit functions as a Divide-by-(x+2) circuit, and when $mcd_1=1$, the circuit functions as a Divide-by-Three circuit.

Figure 16:
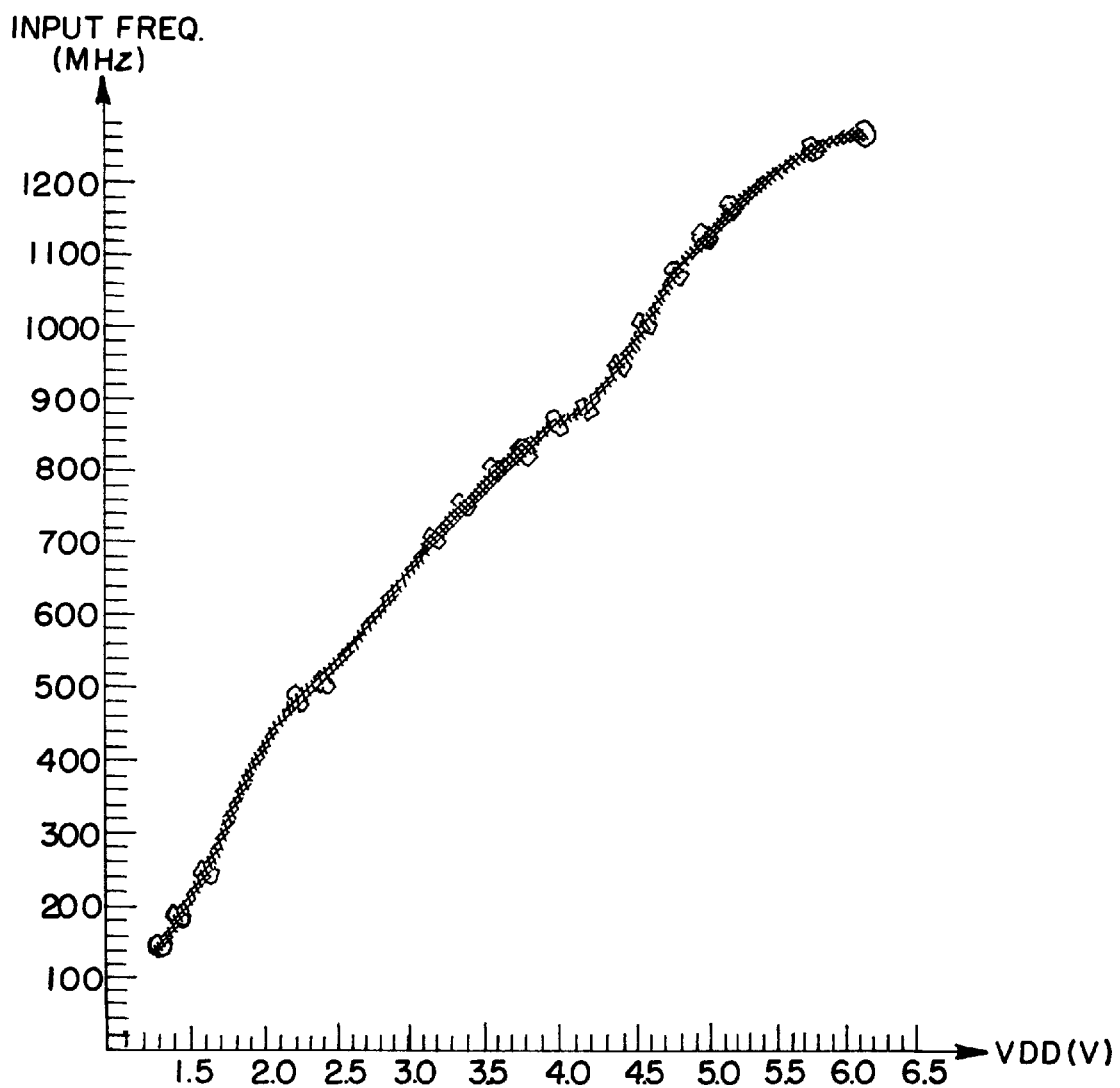
FIG. 16 is a graph showing the relationship between the maximum operating frequency and the supply voltage VDD.
Figure 17A:
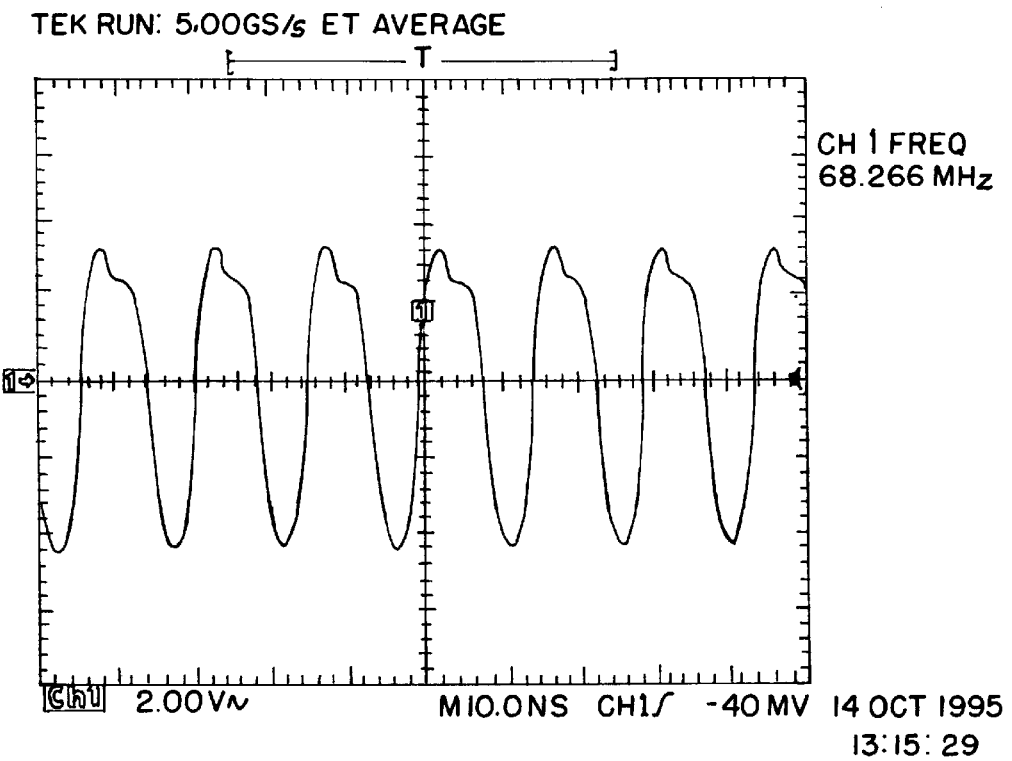
FIG. 17(a) is a chart of the output signal of a Divide-By-15 circuit according to the invention with an input signal having a frequency of 1024 MHz.
Figure 17B:
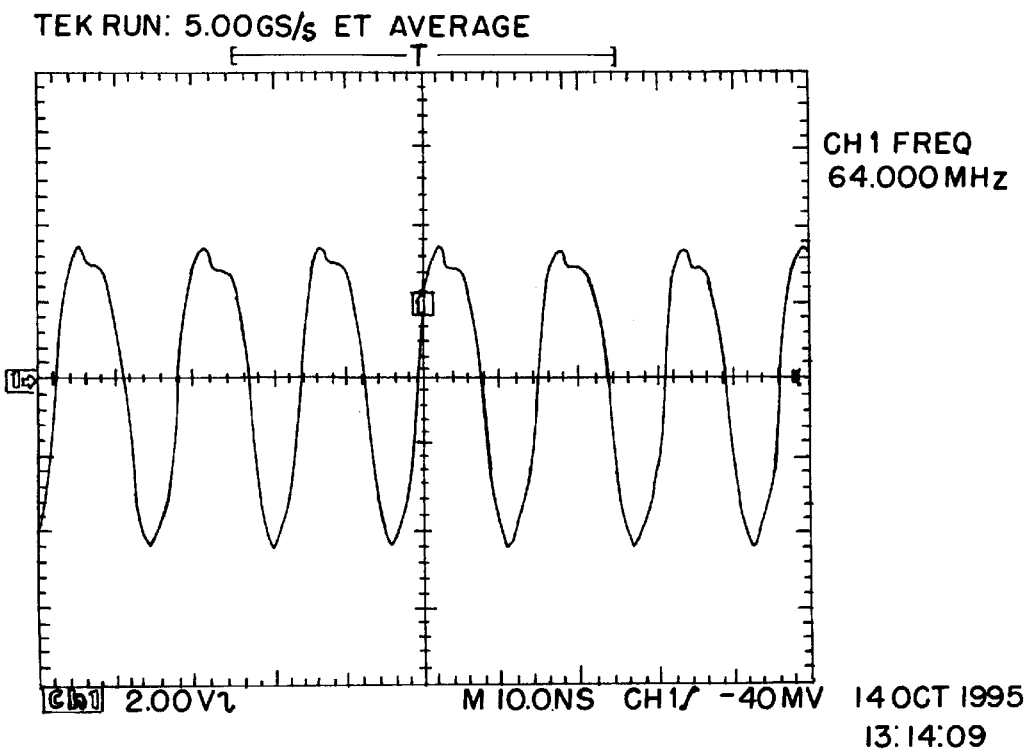
FIG. 17(b) is a chart of the output signal of a Divide-By-16 circuit according to the invention with an input signal having a frequency of 1024 MHz.

Using the Divide-by-15/16 circuit according to the invention as an example, the relationship between the highest input operation frequency and the input power supply VDD is shown in FIG. 16. When VDD is higher, then the input operation frequency is higher. FIG. 17 shows the input signal chart when the input frequency is 1024 MHz.

The high-frequency CMOS dual/multi modulus prescaler according to the invention includes a dual modulus prescaler or multi modulus prescaler in an effective TSPC construction. Thus it is able to use simple CMOS circuitry to work in a high frequency environment. This CMOS technology has the benefit of low-power consumption and can be easily integrated with other CMOS technology. When a dual/multiple modulus prescaler according to this invention is produced with 0.8-$\mu$m SPDM CMOS technology, its operating frequency can be up to 1 GHz.

The invention being thus described, it will be obvious that the same may be varied in many ways. Such variations are not to be regarded as a departure from the spirit and of the invention, and all such modifications as would be obvious to one skilled in the art are intended to be included within the scope of the following claims.

We claim:

1. A divide-by-3/4 circuit, comprising:

a dual modulus prescaler; and three sequentially connected half transparent registers.

* * * * *